(12) United States Patent
Khusnatdinov et al.

(10) Patent No.: US 11,073,758 B2
(45) Date of Patent: Jul. 27, 2021

(54) IMPRINT APPARATUS CONTROL, CONTROL METHOD AND MANUFACTURING METHOD

(71) Applicant: CANON KABUSHIKI KAISHA, Tokyo (JP)

(72) Inventors: Niyaz Khusnatdinov, Round Rock, TX (US); Mario Johannes Meissl, Austin, TX (US)

(73) Assignee: CANON KABUSHIKI KAISHA, Tokyo (JP)

(*) Notice: Subject to any disclaimer, the term of this patent is extended or adjusted under 35 U.S.C. 154(b) by 387 days.

(21) Appl. No.: 16/177,143

(22) Filed: Oct. 31, 2018

(65) Prior Publication Data
US 2020/0133120 A1  Apr. 30, 2020

(51) Int. Cl.
  *G03F 7/00* (2006.01)
  *B29C 43/58* (2006.01)
  *B82Y 40/00* (2011.01)

(52) U.S. Cl.
  CPC ............ *G03F 7/0002* (2013.01); *B29C 43/58* (2013.01); *B82Y 40/00* (2013.01)

(58) Field of Classification Search
  CPC ....... G03F 7/0002; B29C 43/58; B82Y 40/00; F16F 15/03; F16F 15/003; F16F 15/035; F16F 2222/06; H02K 41/031; H02K 7/09
  See application file for complete search history.

(56) References Cited

U.S. PATENT DOCUMENTS

| | | | | |
|---|---|---|---|---|
| 6,008,881 A | * | 12/1999 | Warmerdam | G03F 7/70833 355/53 |
| 7,383,929 B2 | * | 6/2008 | Korenaga | F16F 15/03 188/267 |
| 7,726,452 B2 | * | 6/2010 | Kraner | F16F 7/1017 188/378 |
| 9,329,473 B2 | * | 5/2016 | Hansen | B82Y 10/00 |
| 10,295,011 B2 | * | 5/2019 | Griffin | F16F 15/035 |
| 10,569,449 B1 | * | 2/2020 | Curts | B29C 59/022 |
| 2002/0140921 A1 | * | 10/2002 | Morisada | G03F 7/709 355/73 |
| 2003/0213382 A1 | * | 11/2003 | Kendale | G03F 7/0002 101/41 |

(Continued)

*Primary Examiner* — Leith S Shafi
(74) *Attorney, Agent, or Firm* — Canon U.S.A., Inc. IP Division

(57) ABSTRACT

An apparatus and method configured to brake and/or dampen an imprint head. The apparatus and method includes a mount attached to a fixed surface, a movable plate movable relative to the mount and configured to hold and move an imprint template or superstrate, at least one electromagnetic actuator with a first electrical terminal and a second electrical terminal, mounted between the movable plate and the mount, wherein an electrical current is applied to the at least one electromagnetic actuator for controlling movement of the moveable plate, an inductance serially connected at the first electrical terminal of the at least one electromagnetic actuator to control the electrical current, and at least one switch serially connectable to the second terminal of the at least one electromagnetic actuator and a terminal of the inductance to switch between a state where the inductance acts upon the at least one electromagnetic actuator or a state where the inductance does not act upon the at least one electromagnetic actuator.

5 Claims, 8 Drawing Sheets

(56) References Cited

U.S. PATENT DOCUMENTS

| | | | |
|---|---|---|---|
| 2004/0263299 A1* | 12/2004 | Noji | F16F 6/00 335/229 |
| 2005/0178280 A1* | 8/2005 | Lee | B29C 33/303 101/453 |
| 2010/0044917 A1* | 2/2010 | Kruijt-Stegeman | G03F 7/0002 264/293 |
| 2011/0018158 A1* | 1/2011 | Menard | H01L 21/67092 264/101 |
| 2011/0163477 A1* | 7/2011 | Butler | F16F 15/0275 264/293 |
| 2013/0182236 A1* | 7/2013 | De Schiffart | G03F 7/709 355/74 |
| 2019/0294057 A1* | 9/2019 | Cox | G03F 7/70716 |

\* cited by examiner

IMPRINT APPARATUS CONTROL, CONTROL METHOD AND MANUFACTURING METHOD

BACKGROUND OF THE INVENTION

Field of the Invention

The present disclosure relates to nanoimprint technology, more specifically braking and dampening imprint heads for use in nanoimprint lithography.

Description of the Related Art

In the semiconductor fabrication field, the use of advanced semiconductor lithography is fast becoming the standard. Techniques being implemented include imprinting with measures in place to maintain a safe clearance between template and wafer during idle times so that the wafer stage can move (in XY-direction) while minimizing the risk of the template and wafer colliding. For example, the wafer stage needs to move, while the imprint head is idle, for tasks like wafer exchanges to maintain a specific resting and/or production current in an imprint system utilizing electromagnetic actuators. While holding these positions, a stable sustained current is needed. However, in cases such as power outages or drastic drops in power, the imprint heads are suddenly released from their equilibrium position.

This sudden change and release can cause the imprint heads to shoot past their equilibrium position and cause possible collision with the substrate. Additionally, an oscillation effect can also occur with the imprint head shooting below equilibrium and a spring pulling it back above equilibrium position with this cycle occurring multiple times. This increases the chances of multiple collisions and damage to occur.

SUMMARY OF THE INVENTION

The various embodiments of the present nanoimprint braking and dampening apparatus and method, have several features, no single one of which is solely responsible for their desirable attributes. Without limiting the scope of the present embodiments as expressed by the claims that follow, their more prominent features now will be discussed briefly. After considering this discussion, and particularly after reading the section entitled "Detailed Description of the Embodiments," one will understand how the features of the present embodiments provide the advantages described herein.

In a first embodiment, an apparatus comprising, a mount attached to a fixed surface, a movable plate movable relative to the mount and configured to hold and move an imprint template or superstrate, at least one electromagnetic actuator with a first electrical terminal and a second electrical terminal, mounted between the movable plate and the mount, wherein an electrical current is applied to the at least one electromagnetic actuator for controlling movement of the moveable plate, an inductance serially connected at a first electrical terminal of the at least one electromagnetic actuator to control the electrical current, and at least one switch serially connectable to the second electrical terminal of the at least one electromagnetic actuator and a terminal of the inductance to switch between a state where the inductance acts upon the at least one electromagnetic actuator or a state where the inductance does not act upon the at least one electromagnetic actuator.

In another embodiment, a method for controlling an apparatus including, a mount attached to a fixed surface, a movable plate movable relative to the mount and configured to hold and move an imprint template or superstrate and at least one electromagnetic actuator mounted between the movable plate and mount, an inductance serially connected at the first electrical terminal of the at least one electromagnetic actuator to control the electrical current, and at least one switch serially connectable to the second electrical terminal of the at least one electromagnetic actuator and a terminal of the inductance to switch between a state where the inductance acts upon the at least one electromagnetic actuator or a state where the inductance does not act upon the at least one electromagnetic actuator, comprising, controlling an electrical current to the at least one electromagnetic actuator for controlling movement of the moveable plate, wherein in the controlling of the electrical current, the at least one switch controls whether the at least one electromagnetic actuator is connected to the inductance.

DETAILED DESCRIPTION OF THE EMBODIMENTS

Example devices, methods and systems are described herein. Any example embodiment or feature described herein is not necessarily to be construed as preferred or advantageous over other embodiments or features. The example embodiments described herein are not meant to be limiting. It will be readily understood that certain aspects of the disclosed systems and methods can be arranged and combined in a wide variety of different configurations, all of which are contemplated herein.

Furthermore, the particular arrangements shown in the figures should not be viewed as limiting. It should be understood that other embodiments might include more or less of each element shown in a given figure. Further, some of the illustrated elements may be combined or omitted. Yet further, an example embodiment may include elements that are not illustrated in the figures.

Because there is a need to control the movement of an electromagnetic actuator while slowing, exemplary embodiments of the present disclosure provide for precisely controlling the braking and dampening of the electromagnetic actuator using a circuit to control the release of stored energy. Pursuant to these exemplary embodiments, collisions and unwanted movement in instances where there is a sudden loss or change in power can be prevented.

Figure 1:
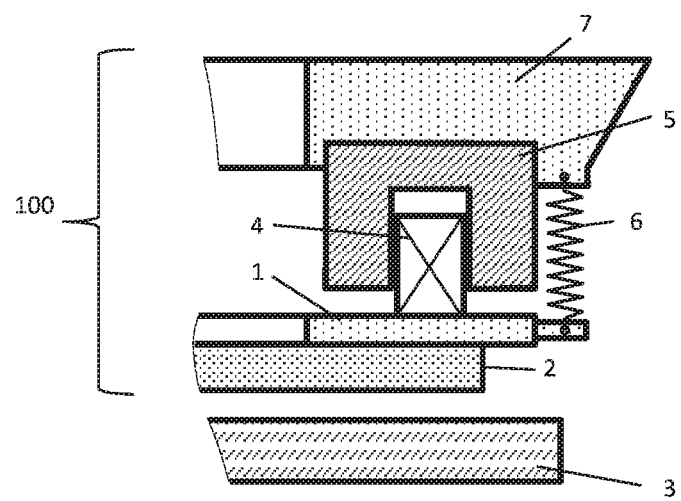
FIG. 1 is a plan view of an imprint head for a nanoimprint lithography system according to an exemplary embodiment of the present disclosure.

FIG. 1 depicts an imprint head for a nanoimprint lithography system according to an exemplary embodiment of the present disclosure. The nanoimprint lithography system includes, but is not limited to, an imprint head 100, moving plate 1, imprint template 2, substrate 3, a control unit to control current or voltage applied to an electromagnetic actuator with voice coil 4 and magnet 5, spring 6 and fixed body 7. The imprint head 100 is a mountable control head with the ability to translate in the Z-direction and rotate about the X and/or Y direction in relation to substrate 3.

The moving plate 1 attaches to fixed body 7 via spring 6 and allows suspension in an equilibrium position or any other specified position. Moreover, moving plate 1 holds imprint template 2 a set distance from substrate 3 and is attached to the electromagnetic actuator which in this example is a voice coil actuator including voice coil 4 and magnet 5. Template 2 may include an imprint surface defining a relief pattern that can be used to form a corresponding pattern in a layer formed on substrate 3. In another embodiment, the imprint surface may be blank, that is, have no pattern, so as to form a planar layer on substrate 3. In an alternative system, moving plate 1 can hold a superstrate that likewise has a flat or planar surface so as to form a planar layer on substrate 3.

As mentioned above, voice coil 4 and magnet 5 make up an example electromagnetic actuator and are controlled by the control unit. In this example, the electromagnetic actuator is positioned between fixed body 7 and moving plate 1 with the voice coil 4 side attached to moving plate 1. However, the sides of the electromagnetic actuator can also be reversed with the voice coil 4 side being attached to the fixed body 7. The electromagnetic actuator being a voice coil actuator in this example, allows an electric current to flow through voice coil 4 creating a magnetic field and magnetic moments with magnet 5. Voice coil 4 can be, but is not limited to, being in the center of and surrounded by magnet 5 allowing vertical movement up and down within a specified range. In another embodiment, magnet 5 is centrally positioned within and surrounded by voice coil 4 allowing the same vertical type movement.

As described above, electric current is applied to the electromagnetic actuator causing attraction or repulsion between the voice coil 4 and the magnet 5 depending on the direction of the electric current. Accordingly, the interaction causes vertical movement of the electromagnetic actuator and the moving plate 1. In another embodiment, there is a plurality of electromagnetic actuators with voice coils 4 and magnets 5 and displacement of each voice coil 4 and magnet 5 pair can be different.

Spring 6 can be but is not limited to, an elastic object that stores mechanical energy. When spring 6 extends from its resting position, it exerts an opposing force approximately proportional to its change in length. Its design can vary from that which is shown for exemplary purposes. In addition, in another embodiment, there is a plurality of springs 6 corresponding to the number of voice coils 4 and magnets 5.

As the tool state can be compromised by, e.g., a power loss, the embodiments described below aim to dampen or brake movement of the electromagnetic actuator when sudden unintended changes in current occur (e.g., power loss) allowing controlled movement to the equilibrium position.

Figure 2A:
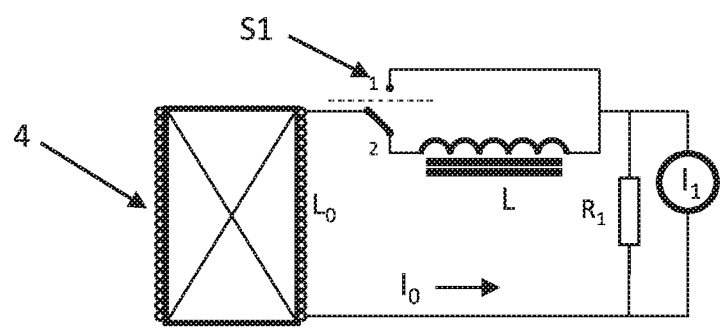
FIG. 2A is a schematic diagram of a dampening circuit for an imprint head according to an exemplary embodiment of the present disclosure.

FIG. 2A is a schematic diagram of a dampening circuit for an imprint head according to an exemplary embodiment of the present disclosure. In this embodiment, the circuit slows electric current changes and the related energy loss stored in voice coil 4. Here, the circuit includes voice coil 4 with inductance $L_0$, switch S1 which can be, but is not limited to, a single pole double throw switch (SPDT) with switchable positions 1 and 2, inductor L and current source $I_1$ in parallel with resistor $R_1$. The inductor L is connected at one terminal of the voice coil 4. The switch S1 is connectable to the other of the voice coil 4 and a terminal of the inductor L. Additionally, current source $I_1$ produces a directional current $I_0$ moving in the direction indicated by the arrow. In this circuit configuration, switch S1 is in position 1 for normal imprinting operation and position 2 as a safety position used to protect moving plate 1 holding imprint template 2 from sudden and unwanted movement during a sudden change in power. Moreover, switch S1 can also be a electromagnetic relay. The moving of switch S1 from one position to another can be done manually by a user of imprint head 100 and/or by computer control done automatically upon, e.g., transition of the tool to an idle state.

As discussed above, position 2 for switch S1 is a safety position. This position can be used in instances where the imprinting operation is paused and/or stopped. In this position, inductance L will slow any movement in the voice coil 4 upon loss of power or big swings in electrical source current. That is, the energy stored in inductance L is used up to maintain the energy in voice coil 4 for a period of time. This feature will prevent the moving plate 1 from quickly accelerating to a position below equilibrium which could cause a collision and/or damage to itself and/or the imprint template 2.

Figure 2B:
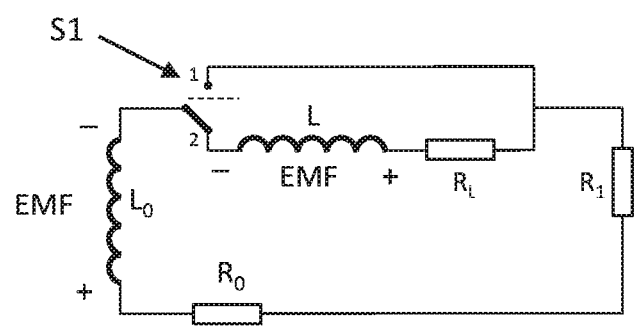
FIG. 2B is a schematic diagram of an equivalent dampening circuit for an imprint head according to an exemplary embodiment of the present disclosure.

FIG. 2B is a schematic diagram of an equivalent dampening circuit for an imprint head according to an exemplary embodiment of the present disclosure. Operation and features of the circuit are similar to those shown and described in FIG. 2A and thus are omitted, only differences are discussed below. This circuit is for a situation of complete power loss where current source $I_1$ is interrupted. In this equivalent circuit, inductor $L_0$ in series with a resistor $R_0$ replaces voice coil 4. In this configuration with the switch S1 in position 2, there is no external electric power anymore and the replaced equivalent of voice coil 4 and inductance L produce electromotive forces (EMF) that drive current $I_0$ in the direction indicated by the arrow (shown in FIG. 2A).

Here, resistor $R_0$ is an active resistance of voice coil 4, and inductance $L_0$ is identical to the inductance of voice coil 4 as shown in FIG. 2A. Resistor $R_L$ is an active resistance of the inductance L. The resistor $R_1$ is needed to allow the electric current to flow when the current source $I_1$ is in the power-off state. To control and change the dampening feature, inductance L can be selected along with values for resistances $R_L$ and $R_1$ according to the following equation:

$$\tau = \frac{(L + L_0)}{(R_0 + R_L + R_1)}$$

Where τ is dampening time.

Figure 3A:
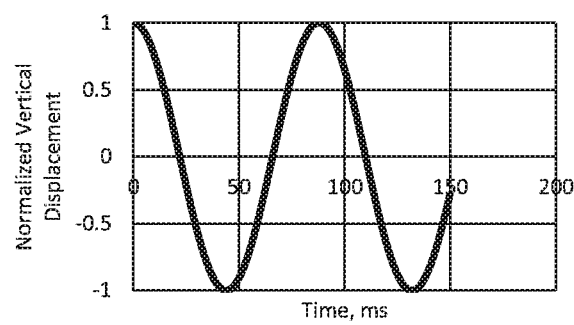
FIGS. 3A and 3B are timing diagrams showing vertical displacement of the imprint head according to an exemplary embodiment of the present disclosure.
Figure 3B:
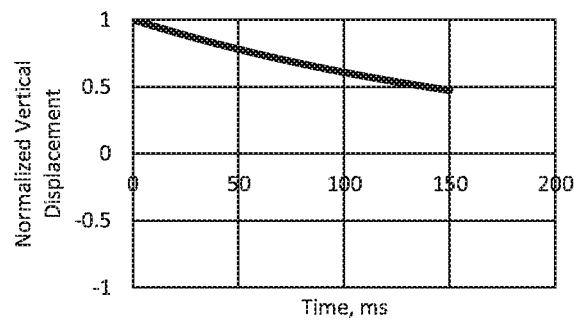

FIGS. 3A and 3B are timing diagrams showing vertical displacement of the imprint head according to an exemplary embodiment of the present disclosure. FIG. 3A shows a normalized vertical displacement of moving plate 1 over time without a dampening or braking circuit applied. In this case, moving plate 1 of the imprint head 100 moves lower than the equilibrium position 0 when current drastically drops presenting a possibility of moving plate 1 and/or imprint template 2 to collide with substrate 3. As such, it would be advantageous to utilize a dampening/braking circuit as described in FIG. 2A or 2B to prevent and minimize possible collision.

FIG. 3B shows normalized vertical displacement of moving plate 1 with the same current as FIG. 3A but with a dampening circuit in place according to a circuit as described in FIG. 2A or 2B. Here, dampening timing τ is set according to the equation above to ensure that moving plate 1 does not fall below the equilibrium position preventing any collision with the substrate 3. As the graph shows, there is no oscillation with respect to normalized vertical displacement but instead a controlled gradual slowing towards the equilibrium position 0. Additionally, with proper selection of resistance and inductance values there is little to no opportunity for the moving plate 1 to fall below the equilibrium point 0.

Figure 4A:
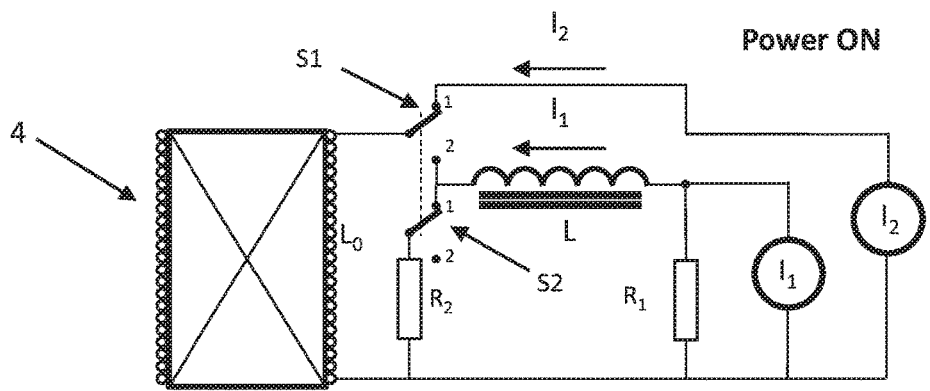
FIG. 4A is a schematic diagram of a braking circuit utilizing stored energy according to another embodiment of the present disclosure.

FIG. 4A is a schematic diagram of a braking circuit utilizing stored energy according to another embodiment of the present disclosure. Here, power is provided to voice coil 4 and energy stored in inductor L is used to compensate for any electric current change and related energy loss in the voice coil 4 and slow the movement of moving plate 1 to equilibrium during a power loss/down event. Moreover, there are switches S1 and S2 that control the operational state of the circuit and multiple current sources $I_1$ and $I_2$ that provide currents $I_1$ and $I_2$, respectively, in the indicated directions. Here, any switch can be replaced with an electromagnetic relay to achieve similar operation and there are two switches and two current sources but there can be more of each. Also, control of switches S1 and S2 can be done manually by a user and/or automatically in a predetermined fashion or upon detection of power loss.

Figure 4B:
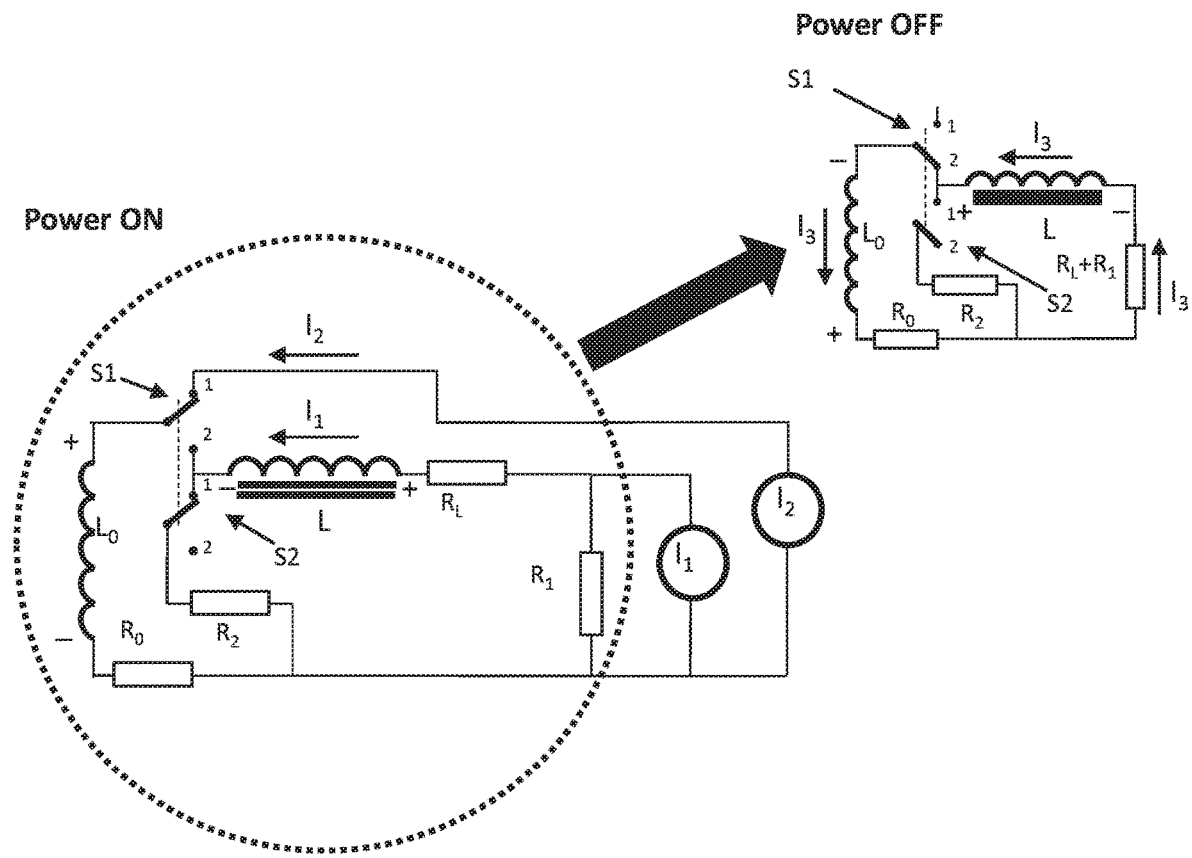
FIG. 4B is a schematic diagram of an equivalent circuit as described in FIG. 4A according to an embodiment of the present disclosure.

In this circuit configuration, operation current $I_1$ and resistors $R_1$ and $R_2$ are selected in such a way that in the off state the electric current $I_3$ limits the downward or upward movement of the moving plate 1 as will be further described in the equivalent circuit shown in FIG. 4B. Moreover, inductor L is energized with stored energy. The electric current $I_1$ is always in the same direction compared to the electric current $I_2$ so during power loss the inductances $L_0$ and L work together to prevent electric current loss. The stored energy of the inductance L is used to reduce the loss of stored energy of inductance $L_0$. Switch position 2 is used to safeguard moving plate 1 against power failure and sudden swings in power. When a power outage occurs, switches S1 and S2 disengage from position 1 into position 2 allowing the inductance L to release the stored energy and provide an electric current preventing voice coil 4 from losing electric current and moving quickly. This slows the voice coil current decay that is associated with the downward or upward movement of moving plate 1 during power loss. Position 2 can also be used as a staging or storage position when the imprint head 100 is not in use. This allows moving plate 1 response to be very slow. Position 2 can also be used for bringing the moving plate 1 in and out of the storage position.

FIG. 4B is a schematic diagram of an equivalent circuit as described in FIG. 4A and shows the operation when power is shut off to the voice coil 4 according to an embodiment of the present disclosure. As described in FIG. 4A, when power turns off, switches S1 and S2 move from position 1 to position 2 which causes the inductances $L_0$ and L to use stored electromagnetic energy to maintain the electric current $I_3$ that is close in value to the original electric current $I_2$ to limit the upward or downward movement of the moving plate 1 based on the starting (before power loss) position of the moving plate 1 below or above its equilibrium position.

Figure 5A:
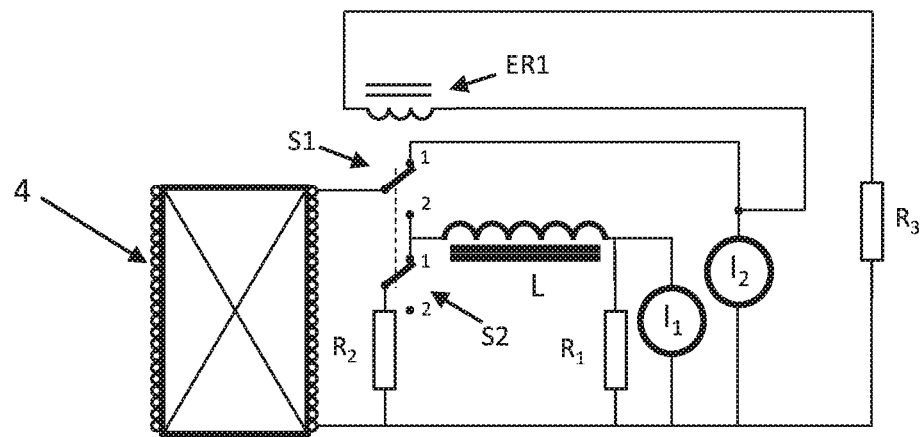
FIGS. 5A and 5B are schematic diagrams of a braking circuit utilizing an electromagnetic relay according to another embodiment of the present disclosure.

FIG. 5A is a schematic drawing of an equivalent circuit as described in FIG. 4A. Here, switches S1 and S2 are operated by an electromagnetic relay ER1 to form a double pole double throw (DPDT) switch. Function and operation are similar to the circuit described in FIG. 4A and as such has been omitted, only differences will be discussed below. Resistor $R_3$ in this circuit is used to control the operational current to the electromagnetic relay ER1. In this configuration, when power is lost or turned off, the electromagnetic relay ER1 disengages and both switches S1 and S2 inside the relay switch from position 1 to position 2.

Figure 5B:
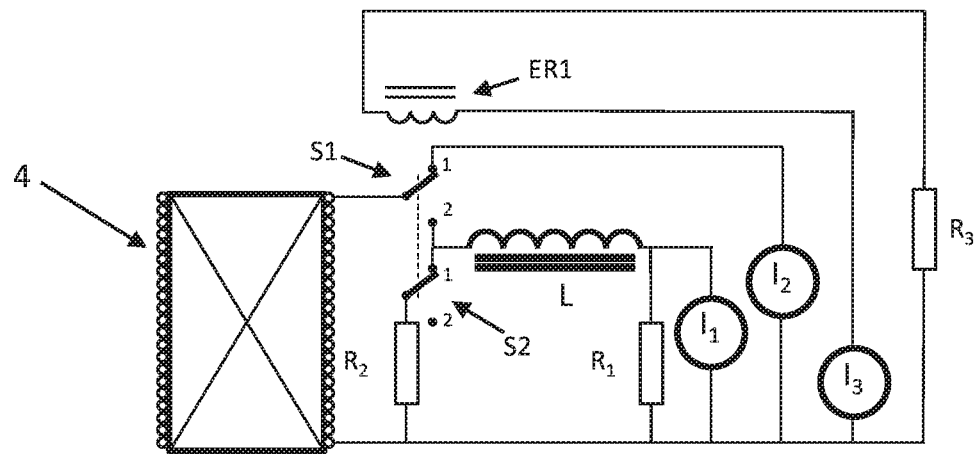

FIG. 5B is a schematic drawing of an equivalent circuit as described in FIG. 4A. Here, switches S1 and S2 are operated by an electromagnetic relay ER1 and form a double pole double throw (DPDT) switch. Function and operation are similar to the circuit described in FIG. 5A and as such has been omitted, only differences will be discussed below. Here, the electromagnetic relay ER1 has its own separate current source $I_3$ for power and resistor $R_3$ is used to control the operational current to the electromagnetic relay ER1. In this configuration, operation and function are similar to that of FIG. 5A.

Figure 6:
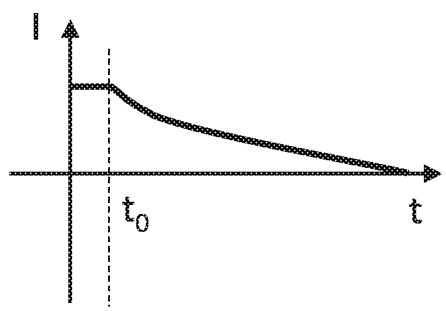
FIG. 6 is a timing diagram showing operation of circuits described in FIGS. 2A & 2B according to an embodiment of the present disclosure.
Figure 6:
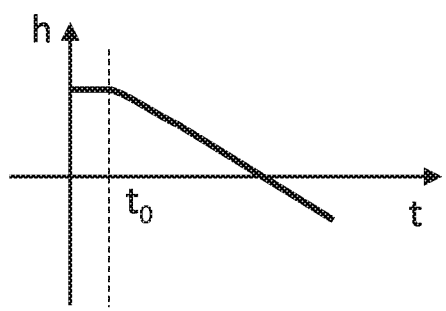

FIG. 6 is a timing diagram showing operation of circuits described in FIGS. 2A & 2B according to an embodiment of the present disclosure. The input resistance of the current source in the off state is very high so when switch $S_1$ is in position 1, voice coil 4 is essentially disconnected or isolated from the rest of the circuit. This can be a case where voice coil 4 is physically disconnected as well. Here, shown along the vertical axis is the relation between current I, and vertical displacement h of the moving plate 1 with respect to time. In this example, the starting position of the moving plate 1 is above its equilibrium position. As shown, the operation is of circuits as described in FIGS. 2A and 2B where switch $S_1$ is in position 1. At time $t_0$, the power is turned off, and the current goes to 0 with some transient time as inductor $L_0$ begins to de-energize. This causes moving plate 1 to move from a starting position to a position below equilibrium and later oscillate.

Figure 7:
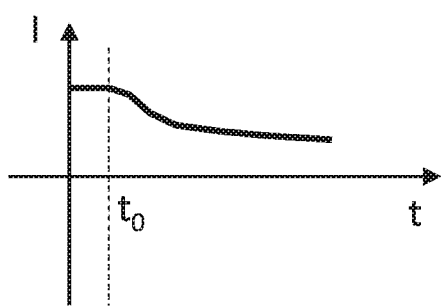
FIG. 7 is a timing diagram showing operation of circuits described in FIGS. 2A & 2B utilizing passive inductance according to another embodiment of the present disclosure.
Figure 7:
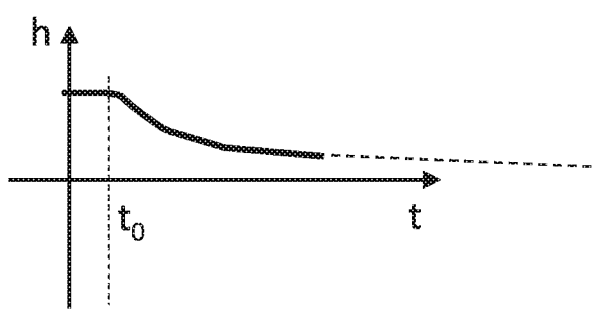

FIG. 7 is a timing diagram showing operation of circuits described in FIGS. 2A & 2B according to another embodiment of the present disclosure. Like FIG. 6, shown along the vertical axis is the relation between current I, and vertical displacement h of the moving plate 1 with respect to time. However, there is a passive inductance L in the circuit. Switch $S_1$ is in position 2 to start with. This is done by an operator as a protection step. At time $t_0$ the power goes off. As described above in a power down/loss state, current slowly goes to 0 while electromagnetic energy stored in both inductances $L_0$ and L is used to maintain the initial electric current. The transient time here is mostly based on the energy stored in inductance L. The moving plate 1 moves gradually towards its equilibrium position with the same transient time.

Figure 8:
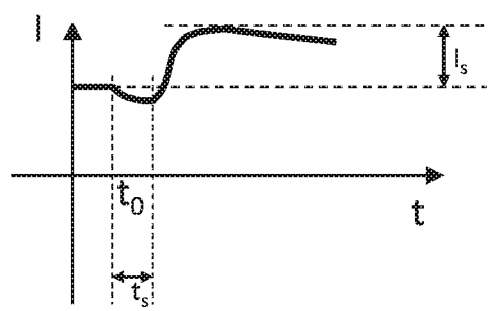
FIG. 8 is a timing diagram showing operation of circuits utilizing an energized inductance according to another embodiment of the present disclosure.
Figure 8:
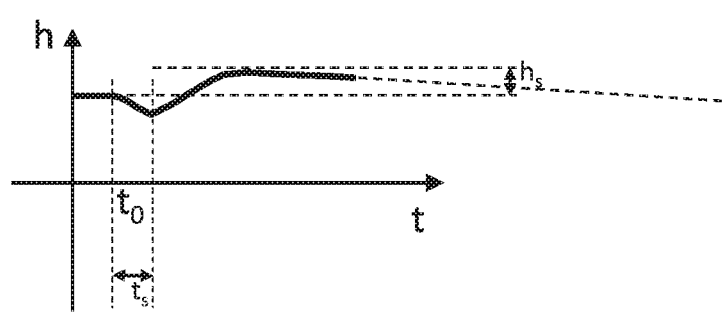

FIG. 8 is a timing diagram showing operation of circuits described in FIGS. 4A, 4B, and 5B according to yet another embodiment of the present disclosure. Shown here is operation of an active brake circuit allowing energy stored in the inductance L to be used for compensation of the energy loss in the voice coil 4 to slow downward displacement of moving plate 1 when starting above the equilibrium position, and upward displacement when starting below the equilibrium position. Shown along the vertical axis is the relation between current I, and vertical displacement h of the moving plate 1 with respect to time. Here, at time $t_0$ the power goes off. Switches $S_1$ and $S_2$ go from position 1 to position 2 within an interval of time which we refer to as switch time $t_s$. As described above in a power down/loss state, during this switch time $t_s$, the electric current tends to decrease while energy stored in the voice coil inductance $L_0$ is used to counteract the current drop. After switching S1 and S2 to position 2, current I quickly increases and in some cases increases into the positive range past its value at time $t_0$. In this example, the inductance L was energized at a higher current $I_1$ than working current $I_2$ of the voice coil. If current $I_1$ is less than $I_2$, current I will increase but not go above its value at time $t_0$. During the switch time $t_s$, plate 1 moves downward, similar to the case shown in FIG. 6. The value of both current $I_s$ and vertical displacement $h_s$, past their values at time $t_0$, can be set by controlling current $I_1$ and/or selecting values for $R_1$ and $R_2$. Moving plate 1 starts upward motion at the moment switches S1 and S2 are in position 2. Eventually, energy from both inductances L and $L_0$ begins to dissipate and moving plate 1 begins motion downward towards the equilibrium position. Since moving plate 1 does not drop past its equilibrium position, moving plate 1 and imprint template 2 are protected from possible collision with substrate 3.

A manufacturing method of a device (a semiconductor device, a magnetic storage media, a liquid crystal display element, or the like) serving as an article will be described. The manufacturing method includes a step of forming a pattern or a planar layer on a substrate (a wafer, a glass plate, a film-like substrate, or the like) using an imprint template or a superstrate by the apparatus described above. The manufacturing method further includes a step of processing the substrate on which the pattern or the planar layer has been formed. The processing step can include a step of removing the residual film of the pattern. The processing step can also include another known step such as a step of etching the substrate using the pattern as a mask. The method of manufacturing the article according to this embodiment is superior to a conventional method in at least one of the performance, quality, productivity, and production cost of the article.

While the present disclosure has been described with reference to exemplary embodiments, it is to be understood that the invention is not limited to the disclosed exemplary embodiments. The scope of the following claims is to be accorded the broadest interpretation to encompass all modifications, equivalent structures and functions.

What is claimed is:

1. A method for controlling an apparatus including, a mount attached to a fixed surface, a movable plate movable relative to the mount and configured to hold and move an imprint template or superstrate and at least one electromagnetic actuator mounted between the movable plate and mount, an inductance serially connected at a first electrical terminal of the at least one electromagnetic actuator to control the electrical current, and at least one switch serially connectable to a second electrical terminal of the at least one electromagnetic actuator and a terminal of the inductance to switch between a state where the inductance acts upon the at least one electromagnetic actuator or a state where the inductance does not act upon the at least one electromagnetic actuator, comprising:

controlling an electrical current to the at least one electromagnetic actuator for controlling movement of the moveable plate, wherein in the controlling of the electrical current, the at least one switch controls whether the at least one electromagnetic actuator is connected to the inductance.

2. The method according to claim 1, wherein when power is not delivered to the imprinting apparatus, the at least one switch is closed to connect the inductance to the at least one electromagnetic actuator.

3. The method according to claim 1, wherein the switch is manually controlled by a user of the imprinting apparatus.

4. The method according to claim 1, wherein when power is not supplied to the imprinting apparatus an electromagnetic relay is configured to switch the at least one switch to a position where the inductance acts upon the at least one electromagnetic actuator.

5. A method of manufacturing an article, the method comprising:

forming a pattern on a substrate while controlling an apparatus using a control method according to claim 1; and processing the substrate on which the pattern has been formed to obtain the article.

* * * * *